United States Patent [19]

Bottman

[11] Patent Number: 5,530,367
[45] Date of Patent: Jun. 25, 1996

[54] PULSE BASED CABLE ATTENUATION MEASUREMENT SYSTEM

[75] Inventor: Jeffrey S. Bottman, Seattle, Wash.

[73] Assignee: Fluke Corporaton, Everett, Wash.

[21] Appl. No.: 369,615

[22] Filed: Jan. 6, 1995

[51] Int. Cl.⁶ .......................... G01R 27/28; G01R 31/02
[52] U.S. Cl. .................. 324/616; 324/520; 324/527; 324/539; 324/543; 379/24
[58] Field of Search ........................ 324/520, 527, 324/534, 539, 540, 543, 616, 707, 710; 377/20; 379/24, 26

[56] References Cited

U.S. PATENT DOCUMENTS

| | | | |
|---|---|---|---|
| 3,777,081 | 12/1973 | Vierling et al. | 324/616 |
| 3,818,331 | 6/1974 | Schlosser | 324/616 |
| 3,920,935 | 11/1975 | Vierling et al. | 324/616 |
| 5,128,619 | 7/1992 | Bjork et al. | 324/533 |
| 5,243,294 | 9/1993 | Burnett | 324/535 |
| 5,270,661 | 12/1993 | Burnett | 324/527 |
| 5,416,418 | 5/1995 | Maureira et al. | 324/535 |
| 5,463,317 | 10/1995 | Murphy | 324/520 |

*Primary Examiner*—Kenneth A. Wieder
*Assistant Examiner*—Glenn W. Brown
*Attorney, Agent, or Firm*—George T. Noe

[57] ABSTRACT

A pulse-based cable attenuation measurement system provides a measurement of attenuation characteristics of a cable over a wide frequency spectrum. A main test and troubleshooting unit of a cable test instrument applies stimulus signals via a selected one twisted pair in a LAN cable to a pulse receiver in a remote unit that in turn causes a pulse generator to produce a specified pulse of known amplitude and duration that is applied as a measurement pulse to a separate but adjacent twisted pair within the same bundle or cable. A measurement system analyzes the measurement pulse after it reaches the main unit, and provides attenuation versus frequency information to determine whether the amount of signal loss due to attenuation in the cable is acceptable or not.

7 Claims, 3 Drawing Sheets

PULSE BASED CABLE ATTENUATION MEASUREMENT SYSTEM

CROSS REFERENCE TO RELATED APPLICATION

This application is related to U.S. patent application Ser. No. 08/220,068 filed Mar. 30, 1994, entitled "Cable Crosstalk Measurement System."

BACKGROUND OF THE INVENTION

This invention relates generally to cable testing and troubleshooting, and in particular to measuring the attenuation characteristics of cables.

Local Area Networks (LANs) formed by a large number of interconnected computers, work stations, printers, and file servers are becoming increasingly common in the modern office. A LAN system is most commonly implemented by physically connecting all of these devices with copper-conductor, twisted-pair LAN cables, the most common being an eight-wire cable which is configured in four twisted-wire pairs (commonly referred to simply as "twisted pairs") within a flexible wrapper that may include an electrostatic shield, with each end of the cable terminated in an industry-standard connector. A LAN system that has been poorly installed, or has faulty cables or connectors, can result in data transmission errors. Therefore, the LAN system must be tested to verify proper operation and performance.

Attenuation limit is a specified performance parameter required in a LAN certification tool to indicate the maximum signal loss allowable in a given system. Attenuation may be simply a result of the decrease in the power of a signal as it propagates along a cable, or it may be the result of signal loss through a faulty connector. If the attenuation exceeds the specified limit, then the LAN system is not in compliance with performance specifications.

A conventional method of measuring attenuation is to apply a swept-frequency sine wave signal from a remote unit to the opposite end of a twisted pair of wires in the cable and measuring the signal strength at the near end. The sine wave source is incremented in discrete steps across a range of frequencies, while making measurements, and a list of attenuation versus frequency is generated. This list is compared with a worst-case attenuation versus frequency function specified for the cable installation under test to determine compliance—that is, whether or not the attenuation limit is exceeded. However, this conventional method requires a bulky and complex remote unit in addition to the main measurement unit.

SUMMARY OF THE INVENTION

In accordance with the present invention, a pulse-based cable attenuation measurement system provides a measurement of LAN cable attenuation as function of frequency in order to test and troubleshoot twisted-pair LAN cables.

A main test and troubleshooting unit of a cable test instrument applies stimulus signals via a selected one twisted pair in a LAN cable to a pulse receiver in a remote unit that in turn causes a pulse generator to produce a specified pulse of known amplitude and duration that is applied as a measurement pulse to a separate but adjacent twisted pair within the same bundle or cable. A measurement system analyzes the measurement pulse after it reaches the main unit, and provides attenuation versus frequency information to determine whether the amount of signal loss due to attenuation in the cable is acceptable or not.

A preferred embodiment of the present invention takes advantage of the well-known fact that the frequency spectrum of a pulse may be determined primarily by the width and amplitude of the pulse. A relatively narrow pulse, e.g., on the order of five nanoseconds, will produce a continuous frequency spectrum that has a significant percentage of its power at higher frequencies, e.g., up to 100 megahertz. A main testing and troubleshooting unit and a remote unit are coupled to opposite ends of a cable under test (CUT). A pulse generator within the main unit repetitively applies, under microprocessor control, a fairly wide (e.g., 200 nanoseconds or greater) stimulus pulse via a selected one of a plurality of twisted pairs to a pulse receiver in the remote unit. In response to the stimulus pulse, a pulse generator in the remote unit generates a relatively narrow measurement pulse (e.g., on the order of five nanoseconds) which is transmitted to a measurement circuit in the main unit via a second selected twisted pair whose attenuation characteristics are being measured. The measurement circuit in the preferred embodiment is a waveform digitizer. The waveform digitizer records the received attenuation measurement pulse by means of sequential sampling to provide a reconstructed equivalent-time waveform of the attenuation pulse. A fast Fourier transform (FFT) is performed on the digitized attenuation-pulse waveform record to provide, when normalized and scaled, a table of attenuation versus frequency information. This information may then be used to check against the specified worst-case attenuation requirements for the particular LAN cable to determine compliance with specifications.

The remote unit receives its instructions for performing a particular test from the main unit in the form of pulse trains which are decoded and utilized by a microprocessor resident within the remote unit to activate the measurement pulse generator and to configure the output path to test the twisted pair selected by the main unit. The remote unit will remain in the programmed configuration until it receives and recognizes a new pulse-train encoded command. If anomalies, such as incorrect pulse timing, are detected during a test sequence, the test is aborted and an error message sent to the main unit. In addition to attenuation measurements, the remote may be programmed to facilitate a number of other measurements, such as passive 100-ohm termination for NEXT (near-end crosstalk), passive open circuit for TDR (time domain reflectometry), and pulse train generation for wire mapping.

The attenuation pulse measurement sequence is carried out in such a manner that system errors and crosstalk artifact generated by the stimulus pulse are subtracted out of the final measurement.

It is therefore one object of the present invention to provide a pulse-based measurement system for determining the attenuation of signal strength in a multiple-transmission-line cable.

It is another object of the present invention to provide a measurement system capable of providing an attenuation versus frequency analysis of pulses applied to a transmission-line cable.

It is a further object of the present invention to provide a simple methodology for determining whether a cable under test meets minimum specified performance levels by indicating the maximum signal loss in a given system Other objects, features, and advantages of the present invention will become obvious to those having ordinary skill

DETAILED DESCRIPTION OF THE INVENTION

Figure 1:
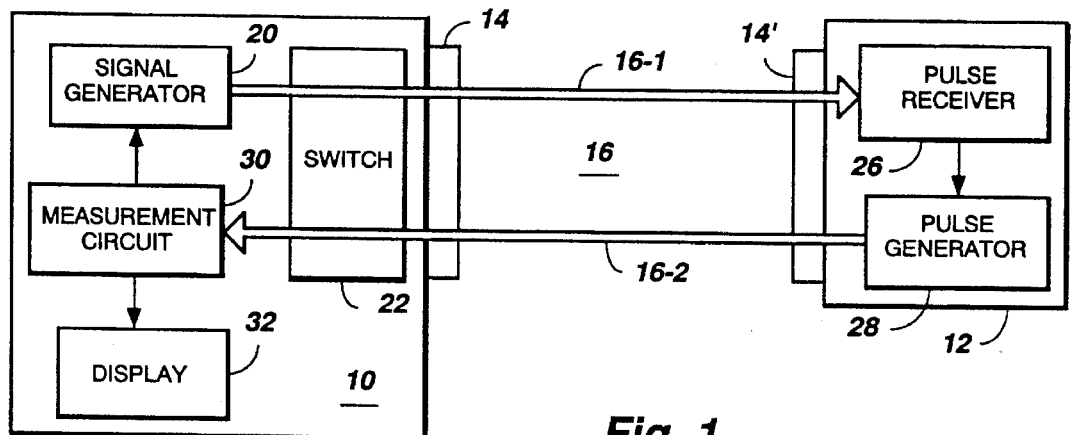
FIG. 1 is a generalized block diagram of a pulse-based cable attenuation measurement system in accordance with the present invention.

Referring to FIG. 1 of the drawings, there is shown a generalized block diagram of a pulse-based cable attenuation measurement system in accordance with the present invention. As will become apparent, the apparatus of the present invention takes advantage of the well-known fact that the frequency spectrum of a pulse may be determined by the width and amplitude of the pulse. A relatively narrow pulse, e.g., on the order of five nanoseconds, will produce a continuous frequency spectrum that has a significant percentage of its power at higher frequencies, e.g., up to about 100 megahertz, while a relatively wider pulse, e.g., on the order of 30 nanoseconds, will produce a frequency spectrum that has a greater percentage of its power at lower frequencies, e.g., up to about 20 megahertz. Thus, a narrow pulse (on the order of five nanoseconds) is chosen for attenuation measurements to a frequency of 100 megahertz.

A main testing and troubleshooting unit 10 and a remote unit 12 are coupled via industry-standard connectors 14 and 14' to opposite ends of a cable under test (CUT) 16. CUT 16 may suitably be an exemplary LAN cable which is configured in at least two twisted-wire pairs (or simply twisted pairs, as they are known in the relevant industry), depicted in FIG. 1 as twisted pairs 16-1 and 16-2. As will be seen, remote unit 12 performs as a pulse repeater, generating a specified pulse for measurement in response to each stimulus pulse or signal received from main unit 10.

A signal generator 20 within main unit 10 repetitively generates stimulus pulses that are applied via a cable selector switch 22 and a first connector 14 to the near end of a first selected twisted pair 16-1 of the twisted-wire pairs. Each stimulus pulse travels along twisted pair 16-1 to remote unit 12 connected to the far end of CUT 16, where such stimulus pulse passes through a second connector 14' and is received by a pulse receiver 26. Pulse receiver 26 is simply a circuit that detects a stimulus pulse and generates a trigger pulse in response thereto, and accordingly may be any of a number of known circuits, such as a logic gate or a comparator. The trigger pulse generated by pulse receiver 26 is applied to a pulse generator 28, which in turn generates a measurement pulse to be measured by the main unit 10. Each so-generated measurement pulse is of a known amplitude and duration and is applied via connector 14' to the far end of a second selected twisted pair 16-2, which is the twisted pair being tested in this case.

A measurement circuit 30 within main unit 10 is coupled via cable selector switch 22 to the near end of second selected twisted pair to receive and measure the measurement pulses generated by pulse generator 28 in remote unit 12. Measurement circuit 30 in the preferred embodiment employs a waveform digitizer to store attenuation pulses, and processing circuitry to perform an attenuation versus frequency analysis on the received measurement pulses, and to provide the resulting information to a user on a display device 32.

Both the main unit 10 and the remote unit 12 are terminated with termination resistors that match the characteristic impedance of the cable, as is well known in the art. Also, both the main unit 10 and the remote unit 12 include as part of the termination balanced-to-unbalanced transformers which are coupled to both ends of CUT 16 to achieve balanced cable drive and to facilitate functions other than the measurement system described herein.

The stimulus pulses and measurement pulses propagate along the twisted pair transmission lines of CUT 16 at a velocity V, which is a percentage of the speed of light and is approximately equal to eight inches per nanosecond (or 20 centimeters per nanosecond) in an electrical cable. The time necessary from launch of a trigger pulse to when measurement circuit 30 receives a measurement pulse is equal to twice the length L of cable 16 divided by velocity V, plus the delay time D incurred within the circuitry of remote unit 12, or elapsed time T=(2L/V)+D. Therefore, the repetition rate of the stimulus pulses should be such that the time between stimulus pulses exceeds a chosen elapsed time T in order to allow a measurement pulse to be processed by measurement circuit 30 before a subsequent stimulus pulse is generated.

The stimulus pulses are preferably synchronized with the measurement circuit to ensure an accurate measure of elapsed time, and to ensure completion of a measurement before a new stimulus pulse is launched. In a preferred embodiment of the present invention, the time between stimulus pulses is about 4.1 microseconds, which means that the stimulus pulse repetition frequency is about 244 kilohertz.

Figure 2:
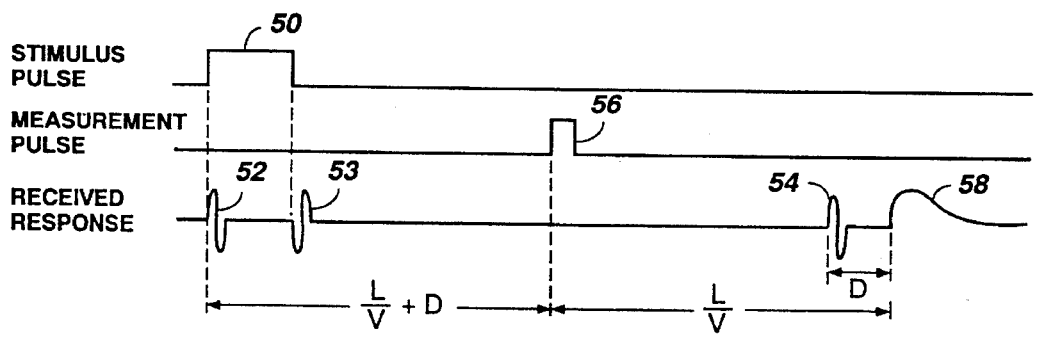
FIG. 2 is a diagram showing a sequence of waveforms and their timing relationship as utilized in the system of FIG. 1.

FIG. 2 is a diagram showing a sequence of waveforms, and the timing relationship therebetween, within the pulse-based cable attenuation measurement system of the present invention. A stimulus pulse 50 is produced by signal generator 20 in response to a command signal from measurement circuit 30, and stimulus pulse 50 is launched into twisted pair 16-1 of CUT 16. Note that the leading and trailing edges of stimulus pulse 50 are coupled across twisted pairs 16-1 and 16-2 and across connectors 14 and 14', and appear as unwanted crosstalk artifacts 52, 53 and 54 on twisted pair 16-2, and hence, to measurement circuit 30. Stimulus pulse 50 in the preferred embodiment is fairly wide, on the order of 240 nanoseconds, to ensure reliable operation of the pulse receiver 26 for cable lengths up to 100 meters. As will be seen later, artifacts 52, 53 and 54 can be removed from the measurement pulse response.

After an elapsed time of (L/V)+D, during which stimulus pulse 50 propagates along twisted pair 16-1 and pulse receiver 26 generates a trigger signal, measurement pulse 56 is generated by pulse generator 28 and launched into twisted pair 16-2. Measurement pulse 56 is chosen to be relatively narrow, for example, on the order of five nanoseconds, because, as mentioned earlier, such a narrow pulse will produce a frequency spectrum that is continuous and fairly flat up to the highest measurement frequency. For example, a five-nanosecond pulse will, when analyzed using a complex Fast Fourier Transform (FFT), produce a usable frequency spectrum over a range from 244 kilohertz to about 150 megahertz. Measurement pulse 56 propagates along twisted pair 16-2, and after an elapsed time of L/V appears at measurement circuit 30 in the attenuated form shown as attenuation pulse 58.

Attenuation pulse 58 contains all the information desired to provide an attenuation versus frequency table. If the cable properties and lengths were all the same, meaning that the elapsed time between stimulus and response would always be the same, it would be a simple matter to mask off all information received by the measurement circuit prior to arrival of the attenuation pulse. However, the unwanted information can be disposed of by subtraction. The measurement sequence is as follows:

First, measurements are taken using a short, substantially lossless reference cable interconnecting main unit 10 and remote unit 12 to develop 0-decibel calibration data which is stored and thereafter used in making measurements on any unknown cables.

Figure 3A:
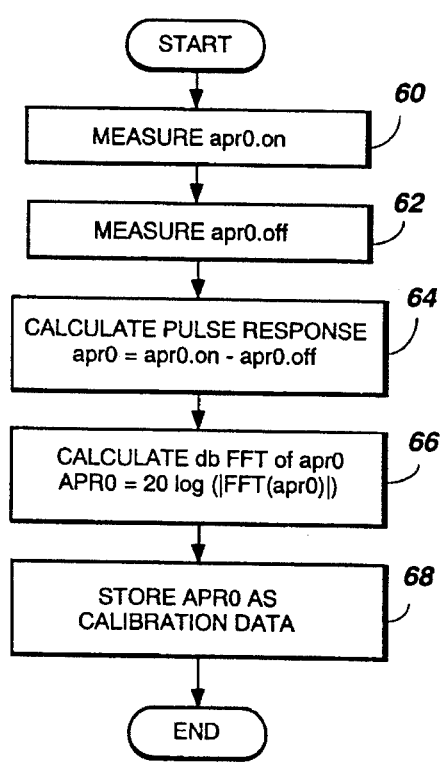
FIGS. 3A and 3B are flow charts of the measurement sequence.

Referring to FIG. 3A, in step 60, a stimulus pulse is applied to the reference cable, and with the remote unit pulse repeater turned on, the attenuation pulse response (apr) is measured. For short-hand purposes, this measurement is referred to as "apr0.on."

In step 62, the measurement is repeated with the remote unit pulse repeater turned off to obtain a measurement referred to as "apr0.off." Note that everything is the same as in step 60, except no measurement pulse is generated by the remote unit.

In step 64, the crosstalk artifacts (52, 53 and 54 in FIG. 2) are removed by subtraction, leaving only the measurement pulse response of the reference cable, or apr0= apr0.on−apr0.off.

In step 66, the db FFT of apr0 (APR0) is calculated using the expression APR0=20*log (|FFT (apr0)|).

In step 68, APR0 is stored as calibration data. It should be noted that recalibration is not necessary for every cable measurement, and the stored calibration data should be useful for the measurement of many cables. If stored in a non-volatile memory, calibration data is retained even with batteries removed.

Figure 3B:
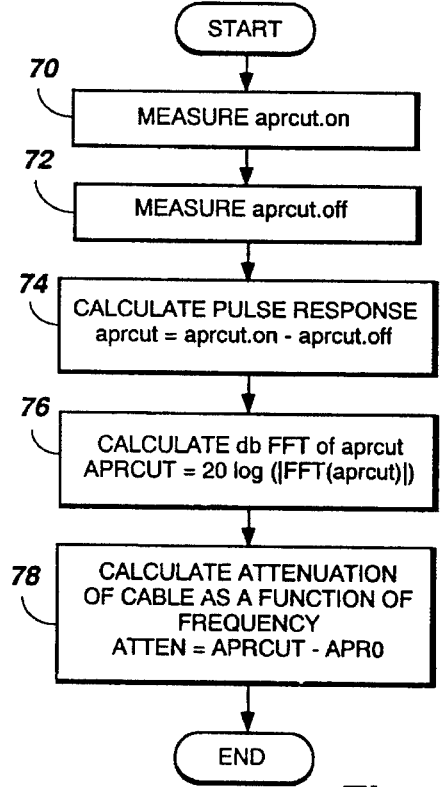

Now referring to FIG. 3B, the measurement of a cable under test (CUT) is described. The cable under test becomes CUT 16 connected at one end to the main unit 10 and connected at the other end to remote unit 12.

In step 70, a stimulus pulse is applied to CUT 16 (the cable under test), and with the remote unit pulse repeater turned on, the attenuation pulse response (apr) is measured. For short-hand purposes, this measurement is referred to as "aprcut.on."

In step 72, the measurement is repeated with the remote unit pulse repeater turned off to obtain a measurement referred to as "aprcut.off." Note that everything is the same as in step 70, except no measurement pulse is generated by the remote unit.

In step 74, the crosstalk artifacts (52, 53 and 54 in FIG. 2) are removed by subtraction, leaving only the measurement pulse response of the cable under test, or aprcut= aprcut.on−aprcut.off.

In step 76, the db FFT of aprcut (APRCUT) is calculated using the expression APRCUT=20*log (|FFT (aprcut)|).

In step 78, the attenuation of the cable under test is calculated as Atten=APRCUT−APR0 (function of frequency).

In the preferred embodiment, the calculation of step 78 yields an attenuation versus frequency table, with attenuation levels given in decibels from 0 to 100 megahertz in discrete 244 kilohertz steps. An operator or the main unit 10 can then compare these attenuation levels with published specifications for the given cable under test.

Figure 4A:
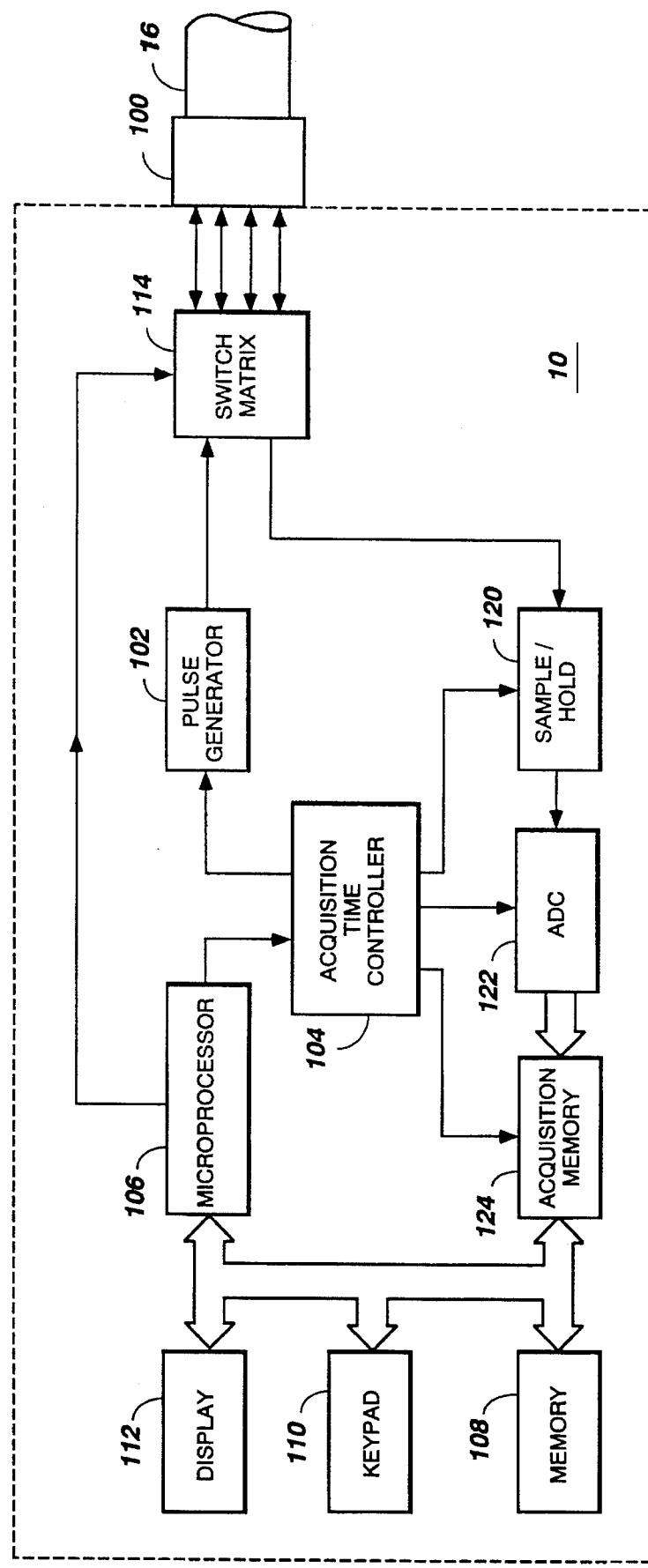
FIGS. 4A and 4B in combination represent a preferred embodiment of the present invention in detailed block diagram form.
Figure 4B:
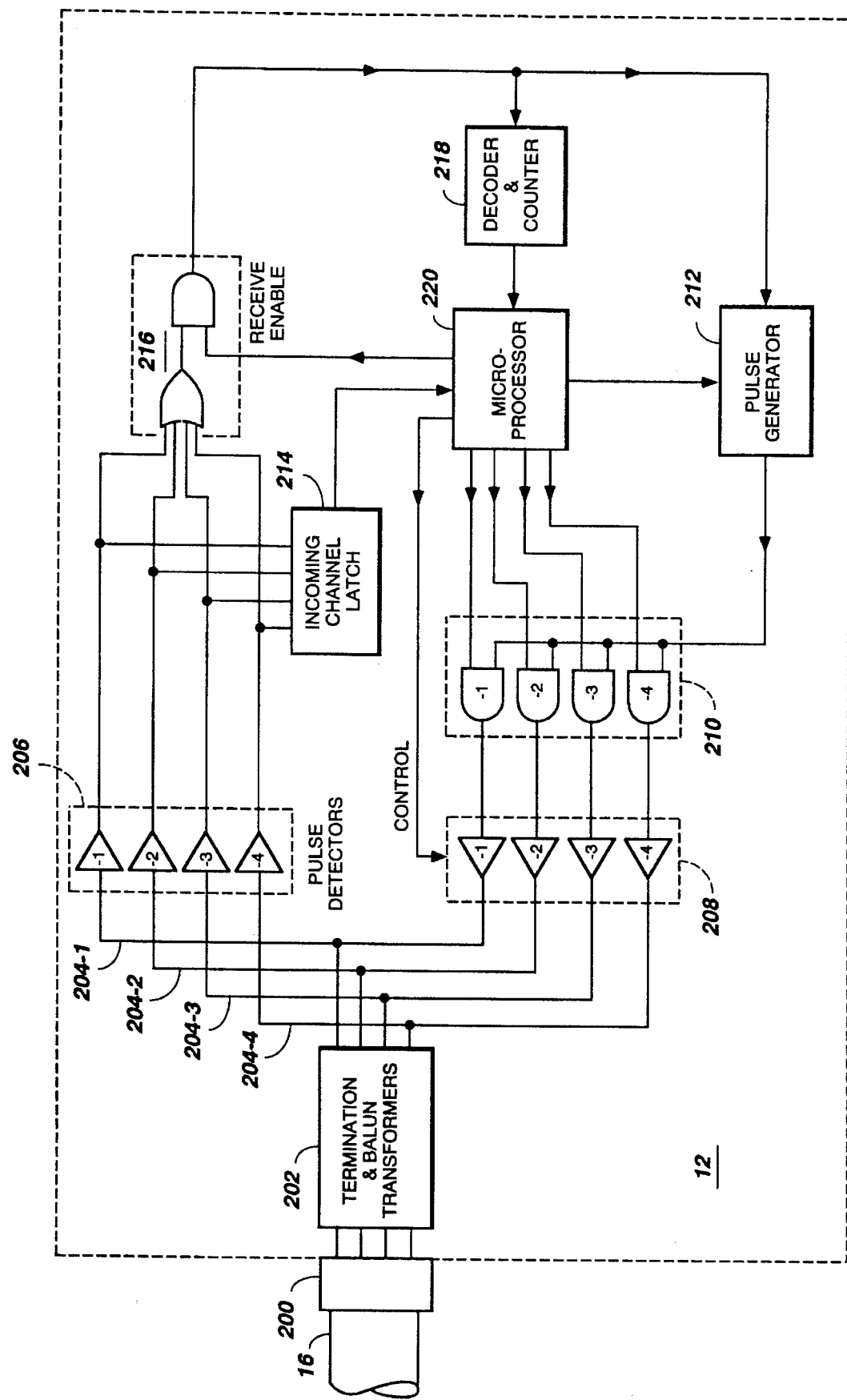

A preferred embodiment of the present invention is shown in FIGS. 4A and 4B. In FIG. 4A, cable test apparatus main unit 10 (shown by a broken line enclosing the circuit elements) is similar to that described in co-pending U.S. patent application Ser. No. 08/220,068, and consequently many of the circuit elements are the same. Main unit 10 includes a connector 100 for connecting the main unit 10 to a cable under test (CUT) 16. The connector 100 may be selected to accommodate any type of cable or any number of transmission lines. In the embodiment shown, connector 100 is an industry-standard RJ-45 connector adapted to mate with the connector of a conventional eight-wire LAN cable which is configured in four twisted-wire pairs. A pulse generator 102 generates a stimulus pulse upon initiation of a pulse command signal from an acquisition timing controller 104 (to be discussed later), which in turn is controlled by microprocessor 106. The stimulus pulses, which are about 240 nanoseconds in width to ensure reliable operation of the remote unit pulse receiver, are repetitively produced about 4.1 microseconds apart, which allows sufficient time for a stimulus pulse to travel the length of CUT 16 to remote unit 12, and for a measurement pulse to return via CUT 16 and be measured by the measurement system (to be discussed).

Microprocessor 106 is connected via a typical bus structure to a memory 108, which may include both random-access and flash read-only memories, a keypad 110 for entry of user-defined information, and a display device 112, which may be a flat-panel liquid-crystal display (LCD) device and its associated display circuitry.

Microprocessor 106 also provides a control signal to switch matrix 114, which may suitably consist of digitally-controlled relays of conventional design for routing a stimulus pulse from pulse generator 102 to a selected twisted pair, and measurement pulses from another twisted pair to the measurement system.

The measurement system includes a waveform digitizer similar to that used for digitizing waveforms of input signals in a conventional digital storage oscilloscope, and therefore includes conventional and well known elements, and is operated in a conventional mode known in art as sequential sampling wherein samples acquired from a number of repetitive signals are later reconstructed in an equivalent-time record representing one real-time signal. This permits sampling a higher effective rate than the available sampling clock rate, which is required to sample attenuation pulse response signals that are transmitted from remote unit 12 as five-nanosecond duration measurement pulses.

Attenuation pulse response signals received via switch matrix 114 from the twisted pair being monitored are applied to a sample/hold amplifier 120 which freezes the amplitude of the crosstalk signal long enough to be converted to a digital representation by analog-to-digital converter (ADC) 122. If desired, suitable signal conditioning circuits, such as amplifiers, attenuators, filters, etc., may be interposed in the signal path before digitizing in order to match signal conditions with the capabilities of the waveform digitizer.

Acquisition timing is provided by acquisition timing controller 104, which may suitably be a digital signal processor (DSP) in combination with a programmable logic device and a high-speed (about 60 megahertz in this embodiment) clock oscillator to provide the desired timing and control. Acquisition time controller 104 initiates pulse command signals to pulse generator 102, as discussed earlier, and also applies sample/hold signals to sample/hold amplifier 120 and conversion control signals to ADC 122 at a rate of about four megahertz. The sample/hold and ADC control signals are generated in progressively increasing delay increments of two nanoseconds via an internal delay line following initiation of pulse command signals applied to pulse generator 102. Thus, while the conversion rate of sample/hold amplifier 120 and ADC 122 in this embodiment is about four megahertz, the well-known sequential sampling technique permits an effective sampling rate of 500 megahertz. In accordance with the well-known Nyquist sampling theorem, this permits sampling attenuation response pulses in a frequency spectrum to 250 megahertz.

The converted digitized samples, each representing an instantaneous amplitude of the received attenuation response pulse, are transported by the acquisition timing controller to a fast acquisition waveform memory 124. Although the samples may not be obtained in chronological order, they are reordered into their proper time sequence when stored in memory 124, as is well known to those skilled in the art. Thereafter, the waveform record is retrieved by microprocessor 106 and moved to memory 108. Thus, the waveform digitizer records the received attenuation response pulse waveform by means of sequential sampling to provide a 2048-point record, with two nanosecond sampling interval spacing, of a reconstructed equivalent-time waveform of the attenuation response pulse.

Calculations are performed by microprocessor 106 in accordance with the sequence described in connection with FIGS. 3A and 3B to provide, when normalized and scaled, a table of attenuation versus frequency information which may be viewed on display device 112. This information may then be used to check against the specified worst-case attenuation requirements for the particular LAN cable installation to determine compliance.

All actions performed by remote unit 12 are requested by main unit 10. Remote unit 12 responds to communications and commands sent on any twisted-wire pair, decodes instructions, and configures itself to send measurement pulses on any twisted-wire pair selected by main unit 10 in response to stimulus pulses received.

FIG. 4B shows the details of remote unit 12 in block diagram form. Remote unit 12 includes a connector 200 for connecting the remote unit 12 to the cable under test (CUT) 16. The connector 200 may be selected to accommodate any type of cable or any number of transmission lines. In the embodiment shown, connector 200, like its counterpart connector 100 on the main unit 10, is an industry-standard RJ-45 connector adapted to mate with the connector of a conventional eight-wire LAN cable which is configured in four twisted-wire pairs. Block 202 represents the cable termination resistors which match the characteristic impedance of the cable, as well as the balanced-to-unbalanced transformers for achieving balanced cable drive, as mentioned earlier. Wires 204-1, 204-2, 204-3, and 204-4, which correspond to the four twisted-wire pairs of CUT 16, are connected to the inputs of pulse detectors 206-1, 206-2, 206-3, and 206-4, and are further connected to the outputs of measurement-pulse drivers 208-1, 208-2, 208-3, and 208-4. The inputs of the measurement-pulse drivers 208-1, 208-2, 208-3, and 208-4 are connected to the outputs of channel-selector gates 210-1, 210-2, 210-3, and 210-4, which in turn direct the output of a pulse generator 212. Connected to the output of pulse detector 206 are an incoming channel latch 214 and a detected-pulse gate 216, which in the preferred embodiment is simply a combination of logic gates. The output of detected-pulse gate 216 is coupled to an input of pulse generator 212 and to a decoder 218. The remote unit receive (stimulus) and transmit (response) functions are controlled by a microprocessor 220, which is interconnected with all of the elements 210 through 218.

Operation of the remote unit 12 is as follows: Initially, microprocessor 220 is in a quiescent, inactive state. Microprocessor 106 and pulse generator 102 within main unit 10 generate specific instructions in the form of pulse trains of different lengths, for example, pulse-train lengths of from two to seventeen pulses, for different functions. These instructions are transmitted via CUT 16 to the remote unit 12 and are decoded by decoder 218, which acts as a pulse counter in the preferred embodiment. The instruction pulse trains are made up of pulses which each have a width of 200 nanoseconds and a period of two microseconds. After a period of three microseconds, as determined by a timing circuit such as an RC network, without receiving a rising edge of a pulse, microprocessor 220 is signaled that the instruction pulse train has ended. Thereafter, microprocessor 220 will retrieve incoming channel information from latch 214, and will process the pulse train count along with the channel that the pulse train was received on. Microprocessor 220 enables one of the gates 210, configuring the remote unit 12 to transmit on a channel determined from the instructions. When the remote unit 12 is ready for operation, a handshake pulse train is sent to the main unit 10, and thereafter the pulse repeater operation begins. As each 240-nanosecond stimulus pulse is received from main unit 10, it is detected by pulse detector 206, and after a slight delay, pulse generator 212 generates five-nanosecond measurement pulse that is routed through the enabled channel-selector gate 210 and corresponding measurement-pulse driver 208 to the wire pair under test.

It should be noted that pulses trains that have a period greater than three microseconds, as determined in the preceding paragraph, will not cause the counter within decoder 218 to increment. Since the stimulus pulse train for the attenuation measurement herein described always has a period greater than four microseconds, the stimulus pulses are not counted by decoder 218 and thus are not interpreted as a command or instruction.

The remote unit will remain in the programmed configuration until it receives and recognizes a new pulse-train encoded command. If anomalies, such as incorrect pulse timing, are detected during a test sequence, the test is aborted and an error message sent to the main unit. In addition to attenuation measurements, the remote may be programmed to facilitate a number of other measurements, such as passive 100-ohm termination for NEXT (near-end crosstalk), passive open circuit for TDR (time domain reflectometry), and pulse train generation for wire mapping.

Microprocessor 220 in the preferred embodiment is a type MC68HC705E1, and all of the logic gates are implemented in low-power CMOS parts that are readily and inexpensively available off the shelf. Power draw is low enough to not require an on-off switch. Thus, a low-cost, self-configuring remote that functions essentially as a pulse repeater for LAN attenuation testing is provided.

While we have shown and described the preferred embodiment of our invention, it will be apparent to those skilled in the art that many changes and modifications may be made without departing from our invention in its broader aspects. For example, with appropriate controls and additional circuitry, measurement circuit 30 could be implemented by those skilled in the art as a conventional random-sampling waveform digitizer. Alternatively, single shot acquisition could be implemented with suitable high-speed waveform digitizer circuits and attendant increased cost. It is therefore contemplated that the appended claims will cover all such changes and modifications as fall within the true scope of the invention.

What we claim as our invention is:

1. A cable testing apparatus, comprising:

a main unit and a remote unit coupled to opposite ends of a cable under test;

a pulse generator located in said remote unit for generating pulses of predetermined width and amplitude, said pulse generator being coupled to a far end of a transmission line in said cable under test; and a measurement circuit located in said main unit and coupled to a near end of said transmission line for receiving and measuring said pulses, said measurement circuit including a waveform digitizer to provide a digitized waveform record of said pulses, and a circuit for analyzing said digitized waveform record to provide for said cable under test attenuation versus frequency information over a predetermined frequency spectrum.

2. A cable test apparatus in accordance with claim 1 further comprising a signal generator located in said main unit for generating stimulus signals, wherein said pulse generator in said remote unit generates said pulses in response to said stimulus signals.

3. A cable test apparatus in accordance with claim 1 wherein said stimulus signals are generated in response to a command from said measurement circuit.

4. A cable test apparatus in accordance with claim 1 wherein said means for analyzing said digitized waveform record is a processor which performs a fast Fourier transform.

5. A cable test apparatus in accordance with claim 1 wherein said remote unit automatically configures itself in response to an instruction from said main unit to receive said stimulus signals on a first channel and transmit said pulses on a second channel wherein said second channel is coupled to said transmission line.

6. A cable test system for determining signal attenuation in a cable under test, comprising:

a main unit having a stimulus pulse generator coupled to a near end of a selected one of a plurality of transmission lines within said cable under test, a waveform digitizer coupled to the near end of a selected another of said plurality of transmission lines, and a first processor coupled to said stimulus pulse generator and said waveform digitizer; and a remote unit having a stimulus pulse detector coupled to a far end of said selected one of said plurality of transmission lines, a measurement pulse generator coupled to the far end of said selected another of said plurality of transmission lines, and a second processor coupled to said stimulus pulse detector and said measurement pulse generator;

wherein said stimulus pulse generator applies a stimulus pulse to said one of said plurality of transmission lines responsive to a transmit initiate signal applied by said first processor to said stimulus pulse generator, said pulse detector detects said stimulus pulse and generates a trigger signal, said measurement pulse generator generates a measurement pulse having a predetermined amplitude and width in response to said trigger signal, and said waveform digitizer produces a waveform record of said measurement pulse.

7. A remote unit having a pulse generator for operation with a main cable test system, comprising:

means for connecting said remote unit to a cable under test having a plurality of transmission lines;

a pulse detector coupled to said plurality of transmission lines to detect a pulse train received from said main cable test system on a first one of said plurality of transmission lines;

a decoder for decoding said pulse train to provide an instruction; and a processor responsive to said instruction for activating a signal path to connect an output of said pulse generator to a second one of said plurality of transmission lines.

* * * * *